United States Patent [19]

Machida

[11] Patent Number: 5,448,524
[45] Date of Patent: Sep. 5, 1995

[54] SEMICONDUCTOR MEMORY DEVICE

[75] Inventor: Toru Machida, Tokyo, Japan

[73] Assignee: Seiko Instruments Inc., Tokyo, Japan

[21] Appl. No.: 230,736

[22] Filed: Apr. 21, 1994

[30] Foreign Application Priority Data

Apr. 28, 1993 [JP] Japan .................. 5-102943

[51] Int. Cl.$^6$ ............................. G11C 7/00
[52] U.S. Cl. .................. 365/189.12; 365/78; 365/189.01
[58] Field of Search ............. 365/189.12, 240, 189.01, 365/78

[56] References Cited

U.S. PATENT DOCUMENTS

| | | | |
|---|---|---|---|
| 4,599,710 | 7/1986 | Pelgrom et al. | 365/189.12 |
| 4,912,680 | 3/1990 | Masaki et al. | 365/189.12 X |
| 4,947,410 | 8/1990 | Lippmann et al. | 365/189.12 X |
| 5,243,561 | 9/1993 | Yamauchi | 365/189.12 |
| 5,260,909 | 11/1993 | Davidian | 365/189.12 X |

*Primary Examiner*—Do Hyun Yoo
*Attorney, Agent, or Firm*—Spensley, Horn Jubas & Lubitz

[57] ABSTRACT

An object is to enable a semiconductor integrated circuit device to perform the second action, without waiting for the first action to finish after the first action starts. Aside from a resistor containing input signal pulses, an input signal pulses recognizing circuit is provided so that it detects signal input which activates the second action during the execution of the first action and controls driving with the result thereof. In a device such as EEPROM, CPU moves on the next action after writing operation starts. CPU checks periodically whether writing operation is being conducted or has finished, so that the processing ability of a whole device can be improved to the maximum.

7 Claims, 5 Drawing Sheets

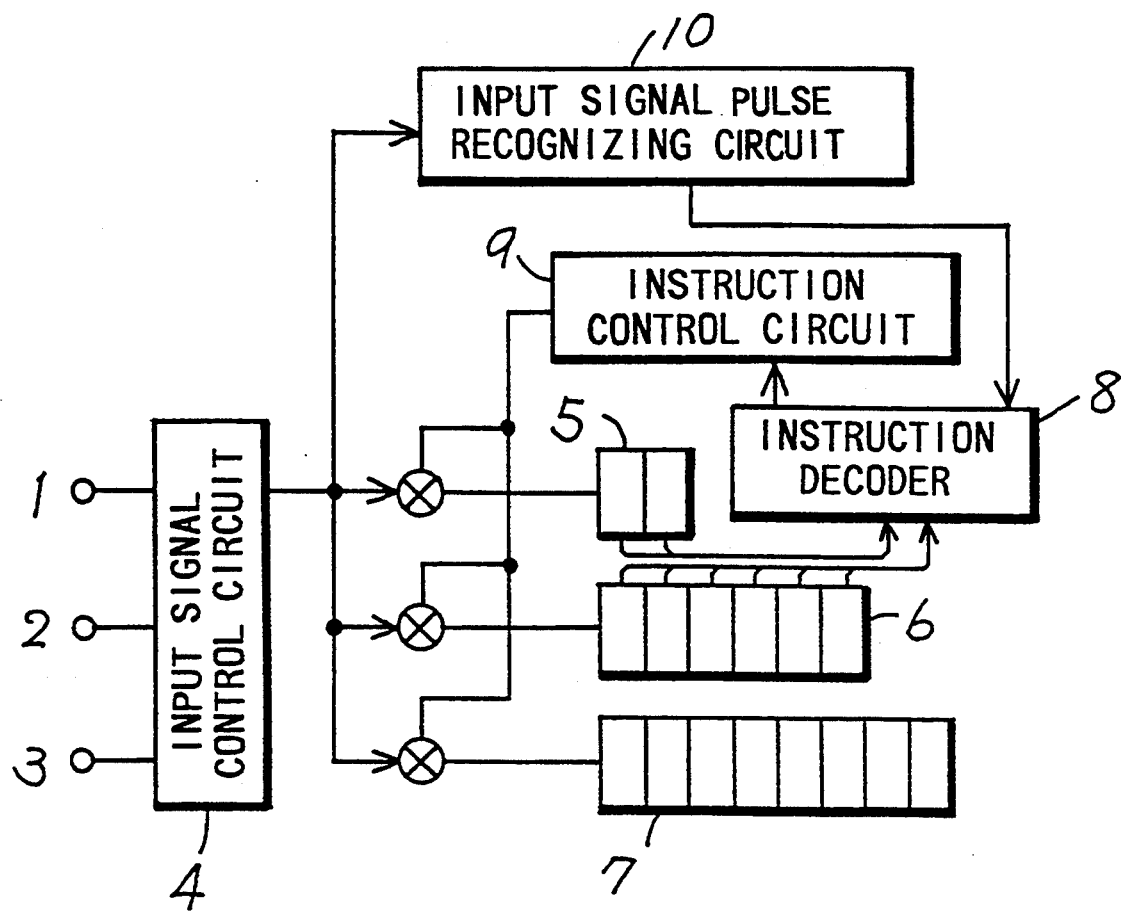
F I G. 1

SEMICONDUCTOR MEMORY DEVICE

BACKGROUND OF THE INVENTION

The present invention relates to a semiconductor memory device including a semiconductor integrated circuit controlled by serial input signal pulses.

A conventional semiconductor integrated circuit carries out predetermined actions by decoding serial input signal pulses sent from a CPU 20 and so on as shown in FIG. 2. An outline of actions thereof will be explained hereinafter referring to the drawings. For more specific and clear explanation, here is illustrated with a semiconductor non-volatile memory device comprising electrically rewritable non-volatile memory elements. (It is hereinafter referred to as EEPROM.)

Serial input signal pulses from CPU 20 and so on separate according to their function and are sent respectively into a CS (Chip Select) input terminal 1, an SK (Serial Clock) input terminal 2, and a DI (Data In) input terminal 3. Then they go through an input signal control circuit 4, and are sent sequentially to a shift register 5 for instruction, a shift register 6 for address, and a shift resister 7 for data. The contents sent to the shift register 5 for instruction and the shift register 6 for address are decoded by an instruction decoder 8 and then sent an instruction order to an instruction control circuit 9. Furthermore, the instruction control circuit 9 controls the data flow of the serial input signal pulses outputted from the input signal control circuit 4.

In general, EEPROM memory cells 21 controlled by the serial input signal pulses have a function of writing an arbitrary data to the specified address and reading same. It sometimes includes the additional function such as allowing the writing operation and prohibiting same.

Adding to data writing operation, a semiconductor memory device using electrically rewritable non-volatile memory cells generally requires longer time in writing than in reading. In other words, it needs several tens of microseconds to a few milliseconds. Thus, some functions of EEPROM can respond promptly to signals given by CPU and so on, the others cannot.

READ (reading) order and PEN (permitting to write) order are typical examples of the order group classified as a prompt response function. On the other hand, PROGRAM (writing) order is one of the orders which the device cannot respond to promptly and have to wait till the end thereof.

However, in a conventional EEPROM comprising a serial input signal circuit shown in FIG. 2, when the processing speed is slower than the speed of serial signal pulses given by CPU and so on, as seen in the writing operation, it needs to wait for that processing to finish. Thus, it restricts considerably the processing ability of the device employing EEPROM per unit time.

Then, another conventional EEPROM comprising a serial signal inputting circuit, which was directed to solve the foregoing problem, will be explained referring to FIG. 3. Similarly to FIG. 2, serial signal pulses from CPU and so on are functionally divided into the CS input terminal 1, the SK input terminal 2, and the DI input terminal 3. Then, they go through the input signal controlling circuit 4 and are sent sequentially to the shift register 5 for instruction, the shift register 6 for address, and the shift register 7 for data. What the shift register 5 for instruction and the shift register 6 for address receive is decoded by the instruction decoder 8, then is sent an instruction order to the instruction control circuit 9 and controls the data flow of the serial input signal pulses outputted from the input signal control circuit 4.

In addition, the contents of the shift register 6 for address is stored in an address latch 11 and is retained therein. On the other hand, the contents of the shift register 7 for data are stored in a data latch 12 and are retained therein.

Thus, all the information needed for writing operation is retained in the instruction control circuit 9, the address latch 11 and the data latch 12. So, even in the execution of writing operation, serial signal pulses from CPU and so on are given to the CS input terminal 1, the SK input terminal 2, and the DI input terminal 3, and after going through the input signal control circuit 4 they are sequentially sent to the shift register 5 for instruction, the shift register 6 for address, and the shift register 7 for data. At that time, the subjects sent to the shift register 5 for instruction and the shift register 6 for address are decoded by the instruction decoder 8 and are sent an instruction order to the instruction control circuit 9. Therefore, even in the execution of writing operation, appropriate performance in accordance with serial signal pulses received from CPU and so on can be realized.

However, in a conventional construction of a serial signal inputting circuit, in the execution of writing operation, address and data both of which are once stored in a shift register have to be transferred for their retainment to the address latch 11 and the data latch 12 respectively. Thus, not only an address latch and a data latch but also a control circuit for forwarding data are provided, the circuit scale of EEPROM has to be very large as a result.

Then, the present invention is directed to solve the above problem of conventional semiconductor memory devices and the purpose thereof is to obtain a semiconductor integrated circuit being able to receive another order during the execution of an order requiring lone time to do, without providing a large-scale circuit.

In other words, the present invention is directed to enable to receive another order during the execution of an order which requires much time to do. Actually, the purpose is that it is possible that CPU can ask whether writing operation has finished or not and EEPROM can respond in accordance therewith. As stated before, a semiconductor nonvolatile memory device comprising electrically rewritable non-volatile memory cells takes generally several tens of microseconds to a few milliseconds to write, which is much longer than the speed of serial pulses from CPU outputs. Then, after EEPROM starts writing operation, CPU sets out another action and ask EEPROM whether it is in the excution of writing operation or not so as to know the end of the writing operation. This is for raising the ability of the semiconductor memory device to its maximum performance.

SUMMARY OF THE INVENTION

For solving the above problem, aside from a register containing input signal pulses, an input signal pulse recognizing circuit means is provided so as to enable to receive another command during the pre-excuted performance.

With a semiconductor integrated circuit constructed as explained up above, the input signal pulse recognizing circuit provided therein separately from a register generates a detect signal when an input code included in the serial input signal pulses corresponds to a predetermined code for detecting a status reading instruction in the serial input signal pulses, so that appropriate operation can be done.

BRIEF DESCRIPTION OF THE DRAWINGS

FIG. 1 is a construction diagram showing an embodiment of the present invention;

DETAILED DESCRIPTION OF THE PREFERRED EMBODIMENTS

Figure 2:
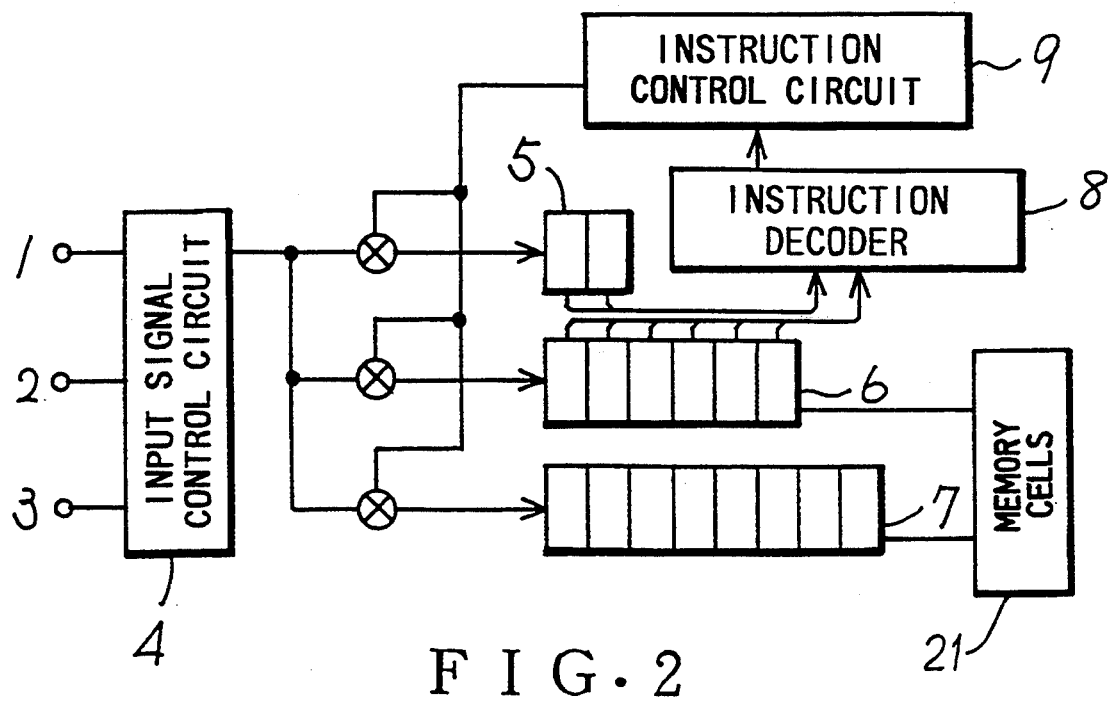
FIG. 2 is a construction diagram showing an embodiment of the prior art.
Figure 3:
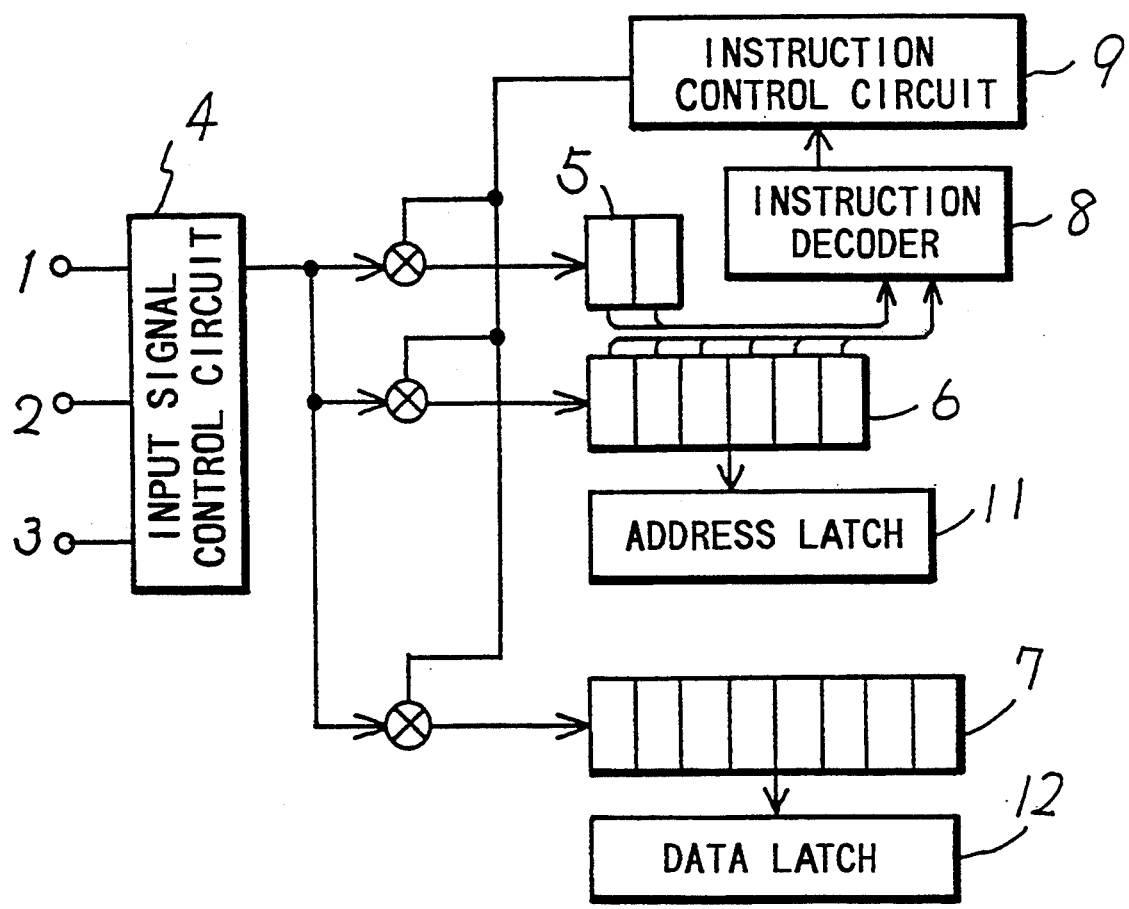
FIG. 3 is another construction diagram showing another embodiment of the prior art.

An embodiment of the present invention will be explained hereinafter referring to the drawings. Similarly to the above, here is illustrated with EEPROM constituting of electrically rewritable non-volatile memory elements, as a semiconductor integrated circuit device controlled by serial input signal pulses, for specific and clear explanation.

The Table 1, as "command set", shows functions that general EEPROM controlled by serial input signal pulses has. Typical commands thereof will be explained referring to the timing diagrams.

TABLE 1

| | Command Set | | |
|---|---|---|---|
| command | instruction code | address | data |
| READ (reading) | 10 | A5 ..... A0 | D7 ........ D0 output |
| PROGRAM (writing) | 01 | A5 ..... A0 | D7 ........ D0 input |
| PEN (allowing to write) | 00 | 0 ..... 0 | not need |
| STRD (status reading) | 11 | 1 ..... 1 | output |

Figure 4:
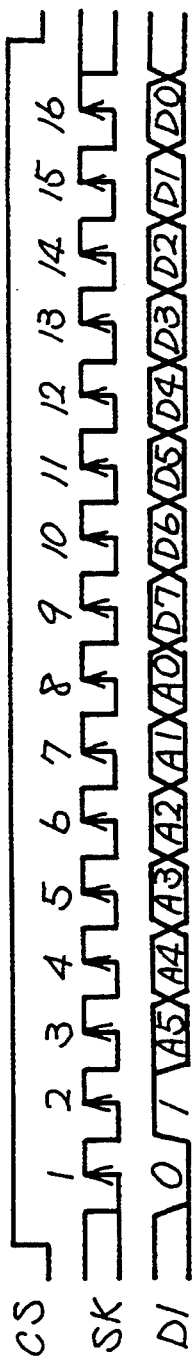
FIG. 4 is a timing diagram of the present invention.

First of all, PROGRAM (writing) command is for writing arbitrary data in an arbitrary address. A timing diagram thereof is shown in FIG. 4. After a potential level of CS (chip select) terminal is changed from L level to H level, an instruction code, address, and data, all of which are prescribed in the command set, are inputted sequentially to DI (data in) terminal an synchronizing with a rising edge from L to H of SK (serial clock) terminal. When the potential level of CS terminal returns from H to L level after receiving the final data D0 at a 16th rising edge of SK, then a command input has finished. Succeedingly, writing operation starts. It takes generally several tens of microseconds to a few milliseconds to end.

Figure 5:
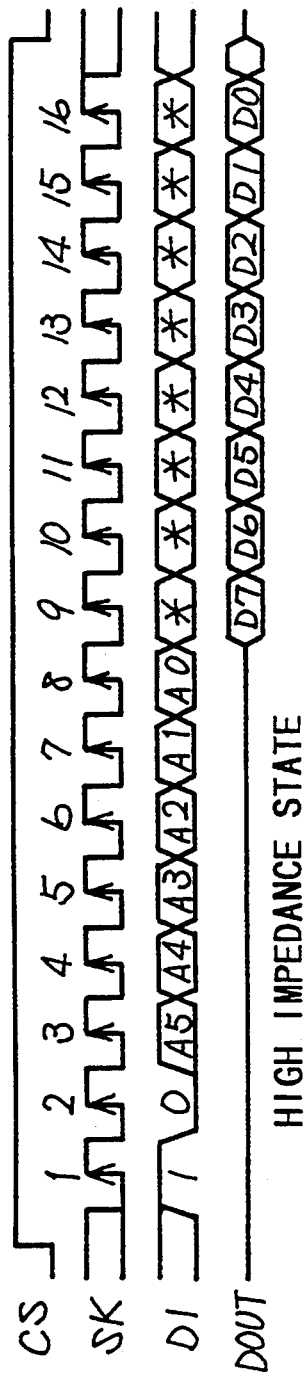
FIG. 5 is a timing diagram of the present invention.

Second, READ (reading) command is for reading data written in advance from an arbitrary address. FIG. 5 shows a timing diagram thereof. After the potential level of CS terminal changed from L to H level, instruction codes and addresses prescribed in the command set are inputted sequentially in the DI terminal on synchronizing with a rising edge of the SK terminal from L to H level. Then, after receiving a last A0 of addresses which are inputted at an eighth rising edge, reading data is sequentially outputted from a transition of SK to DOUT output terminal. The reading data is kept on outputting to the data output terminal until the CS terminal returns from H to L level. The reading operation is faster than at least 10 microseconds.

The READ operation is generally designed so that it can accord with the speed of serial clock outputted from CPU and the like. Therefore, it is not usually necessary to delay the operation speed by adding waiting time and so on.

Figure 6:
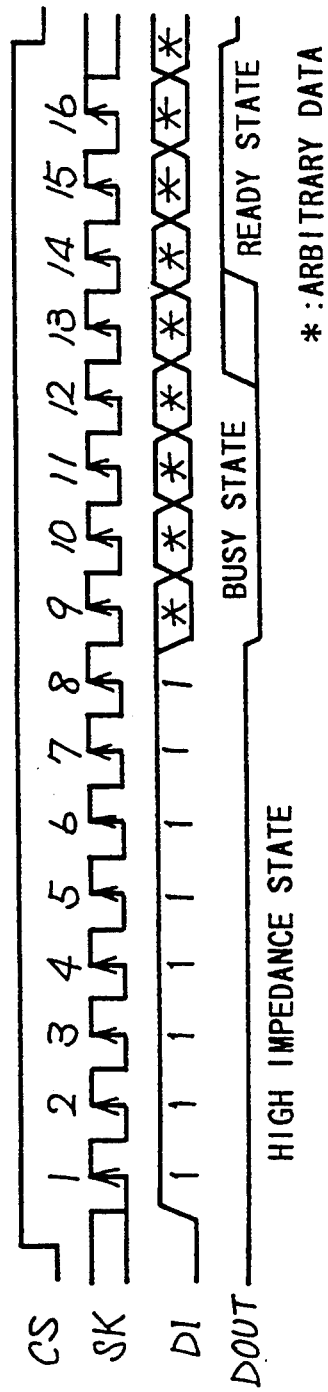
FIG. 6 is a timing diagram of the present invention.

Third, STRD (status reading) command is for judging whether EEPROM is in writing operation or not. A timing diagram thereof is shown in FIG. 6. After the potential level of CS terminal is changed from L to H level, instruction codes and addresses prescribed in the command set are sequentially inputted to the DI terminal in accordance with a rising edge from L to H level of the SK terminal. After receiving a last address A0=H of those inputted at an eighth rising edge of SK, L level data showing busy state if writing operation is proceeding, or H level showing ready state if writing is ended is outputted to the DOUT output terminal from a transition of SK. Until the CS terminal returns from H to L level, data (status data output) is outputted to the data output terminal, which indicates whether writing operation is proceeding or not.

In this embodiment, the length of an instruction code, an address, a data, are set to be 2 bits, 6 bits, 8 bits respectively. However, these bits are not limited to the above length. Further, the instruction codes listed in the Table 1 are for convenience and are not limited to it.

In any command, as shown in FIG. 1, serial input signal pulses from CPU and so on are given to the above-mentioned CS input terminal 1, the SK input terminal 2, and the DI input terminal 3. Then, through the input signal control circuit 4, the instruction codes of 2 bits, the addresses of 6 bits, the data of 8 bits are sent to the shift register 5 for instruction, the shift register 6 for address, the shift register 7 for data, respectively. Given a detailed explanation, when the instruction codes are contained completely in the shift register 5 for instruction at a second rising edge of SK, a command can be recognized. Beside the second rising edge of SK, the instruction such as e.g. the status reading command can be recognized at the eighth rising edge of SK.

Data stored as mentioned above in the shift register 5 for instruction and the shift register 6 for address is sent to the instruction decoder 8 and is decoded therein. A command (instruction command) decoded by the instruction decoder 8 is sent to the instruction control circuit 9 so as to control further data flow. For example, in the case of PROGRAM command, data of 8 bit must be contained succeedingly in the shift register 7 for data. In some cases, it doesn't need to contain data in the shift register for data.

In the case of PROGRAM command, command input has finished when the potential level of CS terminal returns from H to L level after receiving the final data D0 at the sixteenth clock rising edge of SK. Succeedingly, signals being necessary for writing operation of electrically rewritable semiconductor non-volatile memory elements are generated in the inside of a semiconductor integrated circuit. Then, after several tens of microseconds to a few milliseconds, writing operation finishes.

During the writing operation, writing command decoded by the instruction decoder 8, address for writing, and writing data thereof have to be retained, therefore the instruction control circuit 9 controls the data flow inputted from each input terminal so as not to change the contents of data of the shift register 7.

On the other hand, even in the execution of writing operation, serial input signal pulses inputted to each of the CS input terminal 1, the SK input terminal 2, and the DI input terminal 3 are sent to an input signal pulse recognizing circuit 10 through the input signal control circuit 4. At that time, when serial input signal pulses including a status reading instruction given by CPU and so on correspond with predetermined code, the input signal pulse recognizing circuit 10 detects its correspondence and sends a detect signal to the instruction decoder 8, as an appropriate action.

For example, when the input signal pulse recognizing circuit 10 can detect eight-continuous data 1 fulfilling a condition of instruction codes and addresses of STRD (status reading) command, regardless of whether it is in the execution of writing operation or not, it detects and decodes only for STRD command and makes it possible to indicate whether it is in the execution of writing operation or not.

Figure 7:
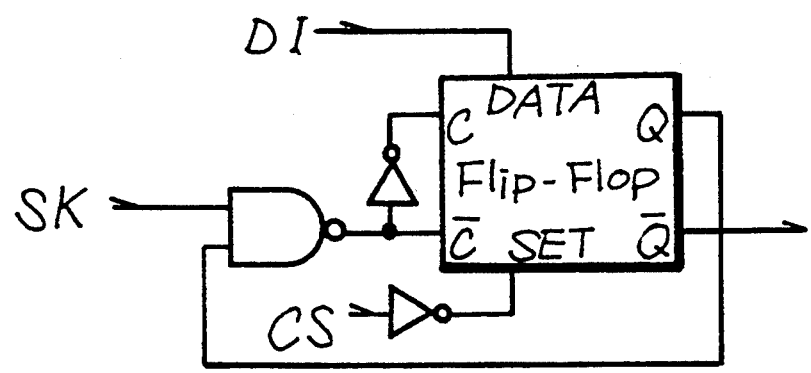
FIG. 7 is a circuit diagram showing an embodiment of the inventive input signal pulses recognizing circuit.

It is very simple to construct the input signal pulse recognizing circuit so as to detect eight-continuous data 1. It can be realized with a flip flop having set function and a small size logic circuit, for example. In other words, reverse signals of CS input, SK input signals, and DI input signals are connected to a set terminal of the above-mentioned flip flop, a clock terminal, and a data terminal respectively. FIG. 7 shows an embodiment of the input signal pulse recognizing circuit.

Of course, serial data detected by the input signal pulse recognizing circuit 10 can be arbitrary configuration, and it is obvious that the input signal pulse recognizing circuit 10 can be realized by an appropriate combination of logic circuits.

Thus, the semiconductor integrated circuit starts a first action by serial signal input pulses given by CPU and so on, and detects serial input signal pulses of a second action without waiting for the first action to finish. As a result, the semiconductor integrated circuit device can process as predetermined.

The present invention has the construction such that the input signal pulse recognizing circuit is provided therein aside from the register for containing input signal pulses, as explained above. The present invention makes it possible that the first action starts in response to serial input signal pulses given by CPU and so on and that other serial input signal pulses enabling the second action to start is detected for doing predetermined action, without waiting the end of the first action, wherein the second action is allowed during the execution of the first action. For example, in the case of EEPROM of a semiconductor non-volatile memory device comprising electrically rewritable non-volatile memory elements, writing operation begins in response to serial input signal pulses given by CPU and the like, then CPU moves on to another action, and CPU can recognizes whether the semiconductor integrated circuit is busy state or ready state by receiving a status data from the semiconductor integrated circuit after sending other serial input signal pulses to the circuit.

As explained above, CPU doesn't move on to next action after writing operation finishes, but checks the end of writing operation at appropriate intervals doing some action. It can raise the processing ability of the whole device to the maximum performance. Especially, in EEPROM, the difference between the first action and the second action in the processing time is more than one digit. Thus, the present invention is very effective for improving the processing ability thereof.

What is claimed is:

1. A semiconductor memory device having a semiconductor integrated circuit for controlling data from CPU to semiconductor memory cells, the semiconductor integrated circuit comprising an input signal control circuit being supplied the data from the CPU and providing serial input signal pulses, a shift register for storing the serial input signal pulses from the input signal control circuit and providing data to the semiconductor memory cells, an input signal pulse recognizing circuit being supplied the serial input signal pulses from the input signal control circuit and generating a detect signal to an instruction decoder for decoding data from the shift register when an input code included in the serial input signal pulses is corresponding to a predetermined code for detecting a status reading instruction in the serial input signal pulses, and an instruction control circuit for controlling data flow of the serial input signal pulses between the input signal control circuit and the shift register in accordance with the detect signal supplied from the input signal pulse recognizing circuit.

2. A semiconductor memory device according to claim 1, wherein the input signal pulse recognizing circuit outputs status data of the semiconductor integrated circuit to the CPU in accordance with the detecting signal.

3. A semiconductor memory device according to claim 1, wherein the serial input signal pulses include instruction data, address data and data to be written in the semiconductor memory cells, and the input signal pulse recognizing circuit detects the status reading instruction from the instruction data.

4. A semiconductor memory device according to claim 3, wherein the input signal pulse recognizing circuit detects the status reading instruction from the instruction data and the address data.

5. A semiconductor memory device according to claim 1, wherein the input signal pulse recognizing circuit comprises a flip-flop circuit.

6. A semiconductor memory device having semiconductor integrated circuit for controlling data from CPU to semiconductor memory cells, the semiconductor integrated circuit comprising an input signal control circuit being supplied the data from the CPU and providing serial input signal pulses, a shift register for storing the serial input signal pulses from the input signal control circuit and providing data to the semiconductor memory cells, an input signal pulse recognizing circuit being supplied the serial input signal pulses from the input signal control circuit and generating a detect signal when an input code included in the serial input signal pulses is corresponding to a predetermined code for detecting a status reading instruction in the serial input signal pulses, an instruction decoder for decoding data from the shift register and being supplied the detect signal from the input signal pulse recognizing circuit, and an instruction control circuit being supplied an instruction signal from the instruction decoder,
wherein the instruction control circuit controls data flow of the serial input signal pulses between the input signal control circuit and the shift register.

7. A semiconductor memory device according to claim 6, wherein the instruction control circuit controls the data flow to provide status data of the semiconductor integrated circuit from the shift register to the CPU, in accordance with the detect signal from the input signal pulse recognizing circuit through the instruction decoder.

* * * * *